United States Patent [19]

Abe et al.

[11] Patent Number: 4,715,392
[45] Date of Patent: Dec. 29, 1987

[54] AUTOMATIC PHOTOMASK OR RETICLE WASHING AND CLEANING SYSTEM

[75] Inventors: Nobutoshi Abe, Kawasaki; Kazunori Imamura, Tokyo, both of Japan

[73] Assignee: Nippon Kogaku K. K., Tokyo, Japan

[21] Appl. No.: 11,413

[22] Filed: Feb. 4, 1987

Related U.S. Application Data

[63] Continuation of Ser. No. 668,012, Nov. 5, 1984, abandoned.

[30] Foreign Application Priority Data

Nov. 10, 1983 [JP]  Japan ................................ 58-211626
Nov. 18, 1983 [JP]  Japan ................................ 58-217434

[51] Int. Cl.$^4$ ............................................. B08B 3/02
[52] U.S. Cl. ........................................ 134/62; 134/66; 134/113

[56] References Cited

U.S. PATENT DOCUMENTS

| | | | |
|---|---|---|---|
| 4,208,760 | 6/1980 | Dexter et al. | 134/133 X |
| 4,282,825 | 8/1981 | Nagatomo et al. | 134/66 X |
| 4,315,705 | 2/1982 | Flint | 414/222 X |
| 4,427,332 | 1/1984 | Manriquez | 414/750 X |
| 4,449,885 | 5/1984 | Hertel et al. | 414/750 |
| 4,466,766 | 8/1984 | Geren et al. | 414/750 X |
| 4,500,407 | 2/1985 | Boys et al. | 414/222 X |
| 4,520,834 | 6/1985 | DiCicco | 134/76 X |

FOREIGN PATENT DOCUMENTS

| | | | |
|---|---|---|---|
| 1956050 | 5/1971 | Fed. Rep. of Germany | 134/62 |
| 53-136358 | 11/1978 | Japan | 134/76 |
| 57-79619 | 5/1982 | Japan | 134/94 |
| 1475686 | 6/1977 | United Kingdom | 134/76 |

*Primary Examiner*—Harvey C. Hornsby
*Assistant Examiner*—Frankie L. Stinson
*Attorney, Agent, or Firm*—Shapiro and Shapiro

[57] ABSTRACT

Automatic photomask or reticle washing and cleaning system comprises a foreign particle inspecting unit for inspecting whether or not foreign particles are attached to the surfaces of substrates; a washing and cleaning unit for washing and cleaning the surfaces of substrates with a cleaning liquid, thereby removing foreign particles and transfer means for withdrawing a substrate from a case, transferring the withdrawn substrate to the washing and cleaning unit, thereafter transferring the washed and cleaned substrate to the foreign particle inspecting unit and finally inserting the inspected substrate into the case again. In the washing and cleaning system, the washing and cleaning unit has a wash tub, means disposed in the wash tub for spraying or jetting a cleaning liquid against the surface of a substrate, means for rubbing the surfaces of the substrate which are wetted by the cleaning liquid, thereby removing foreign particles and washing means for washing away the cleaning liquid still remaining over the surfaces of the substrate even after removal of foreign particles.

9 Claims, 20 Drawing Figures

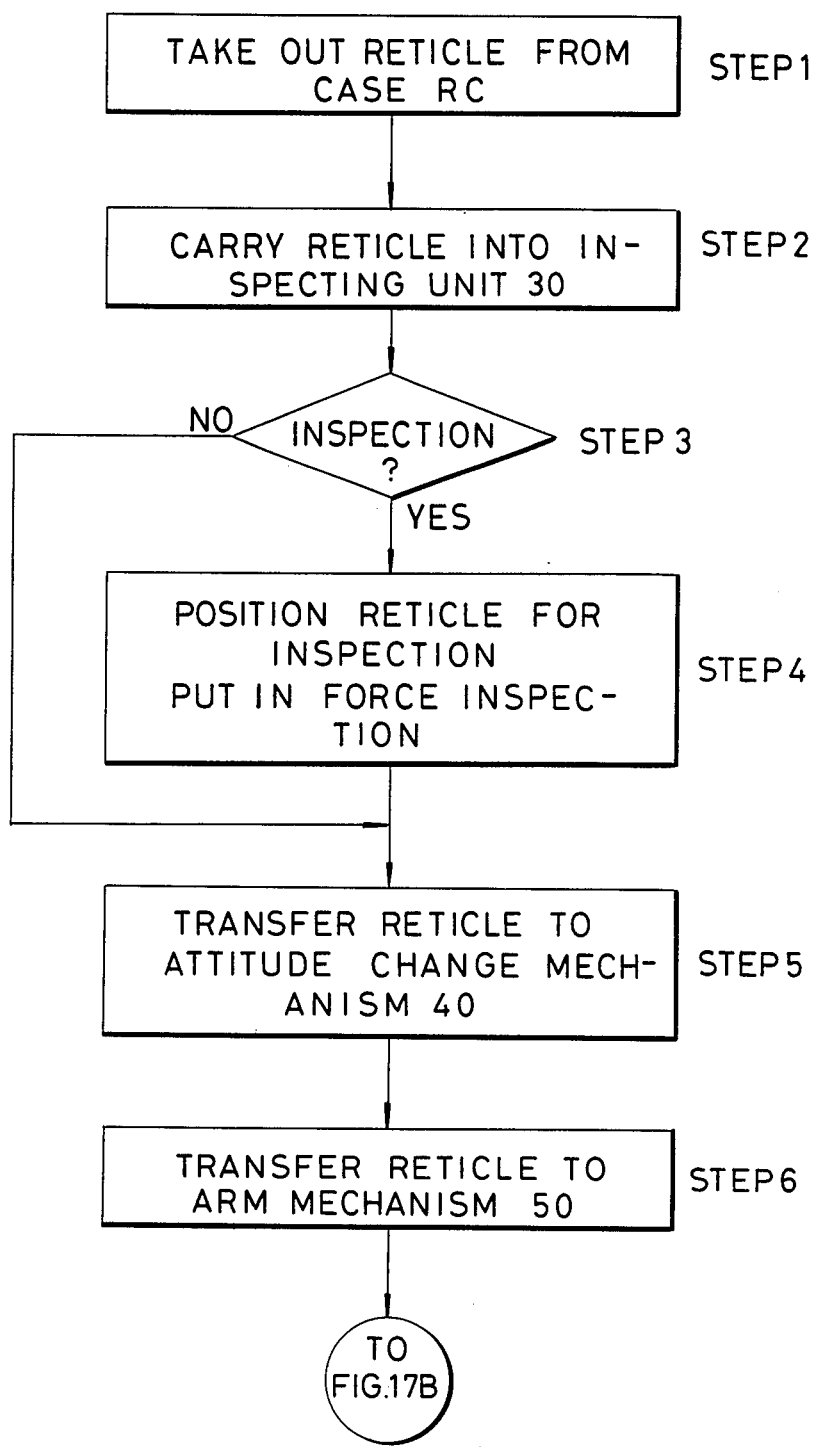

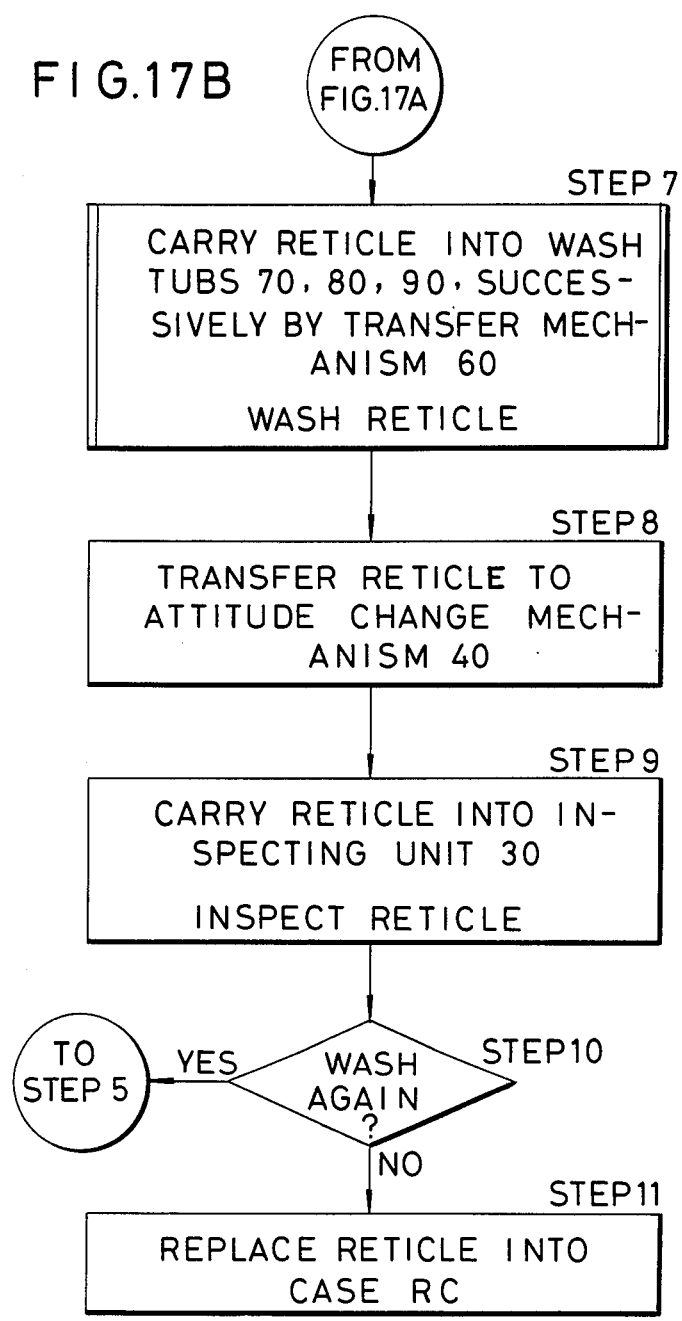

AUTOMATIC PHOTOMASK OR RETICLE WASHING AND CLEANING SYSTEM

This is a continuation of application Ser. No. 668,012, filed Nov. 5, 1984, now abandoned.

BACKGROUND OF THE INVENTION

1. Field of the Invention

The present invention relates to washing and cleaning of a flat substrate and more particularly an automatic washing and cleaning system for automatically washing and cleaning photomasks and reticles used in the fabrication of semiconductor devices.

2. Description of the Prior Art

When foreign particles are attached to photomasks and reticles in the fabrication of semiconductor devices such as ICs and LSIs, these foreign particles are transferred together with a circuit pattern over a wafer in a wafer lithographing step so that the yield of ICs is decreased. Therefore, much time is consumed in order to wash and clean photomasks and reticles so as to remove attached foreign particles and to inspect whether or not attached foreign particles are completely removed. However, when photomasks and reticles are manually handled in the case of washing and cleaning them, there is a high possibility that foreign particles from operators are attached again to photomasks and reticles even when attached foreign particles have been completely removed by washing and cleaning. Thus, there is a problem that no satisfactory result can be attained even though a considerably long period of time is consumed.

In order to overcome the above and other problems, there have been devised and demonstrated various types of washing and cleaning systems in which reticles which are set into a system can be automatically washed and cleaned. However, these systems still require manual operations for setting reticles and removing them so that there still remains a possibility that foreign particles from operators attach to washed and cleaned reticles. Furthermore, when washed and cleaned reticles are inspected by visual inspection, it takes a long time. Thus, the efficiency for obtaining completely washed and cleaned reticles is considerably low. There has been proposed an automatic foreign particle inspection device for automatically inspecting whether or not foreign particles are attached to the surfaces of reticles, but the transfer of reticles from a washing and cleaning unit to the inspection device is made manually. Therefore, even though the inspection time can be shortened and the fatigue problem caused by visual inspection can be reduced, the problem of completely washing and cleaning the surfaces of reticles or the like, thereby removing attached foreign particles has remained.

SUMMARY OF THE INVENTION

In view of the above, the primary object of the present invention is to provide a system for thoroughly washing and cleaning the surfaces of substrates such as photomasks and reticles.

Another object of the present invention is to provide a washing and cleaning system which can effectively remove foreign particles attached to the surfaces of substrates and can maintain high capability in the washing and cleaning step so that dried and clean substrates can be obtained.

A further object of the present invention is to provide a washing and cleaning system in which when substrates are washed and cleaned, no manual handling is needed; foreign particles attached to the surfaces of substrates can be automatically detected so that cleanliness can be confirmed; and washed and cleaned substrates are so handled that they will not be contaminated again.

A washing and cleaning system in accordance with the present invention comprises a foreign particle inspecting unit for inspecting whether or not foreign particles are attached to the surfaces of substrates; a washing and cleaning unit for washing and cleaning the surfaces of substrates with a cleaning liquid, thereby removing foreign particles; and transfer means for withdrawing a substrate from a case, transferring the withdrawn substrate to the washing and cleaning unit, thereafter transferring the washed and cleaned substrate to the foreign particle inspecting unit and finally inserting the inspected substrate into the case again.

In the washing and cleaning system in accordance with the present invention, the washing and cleaning unit has a wash tub, means disposed in the wash tub for spraying or jetting a cleaning liquid against the surface of a substrate, means for rubbing the surfaces of the substrate which are wetted by the cleaning liquid, thereby removing foreign particles and washing means for washing away the cleaning liquid still remaining over the surfaces of the substrate even after removal of foreign particles.

The above and other objects, effects, features and advantages of the present invention will become more apparent from the following description of preferred embodiments thereof taken in conjunction with the accompanying drawings.

BRIEF DESCRIPTION OF THE DRAWINGS

FIGS. 17A and 17B show a flow chart used to explain the mode of operation of the automatic washing cleaning system of the present invention.

DETAILED DESCRIPTION OF THE PREFERRED EMBODIMENTS

Figure 1:
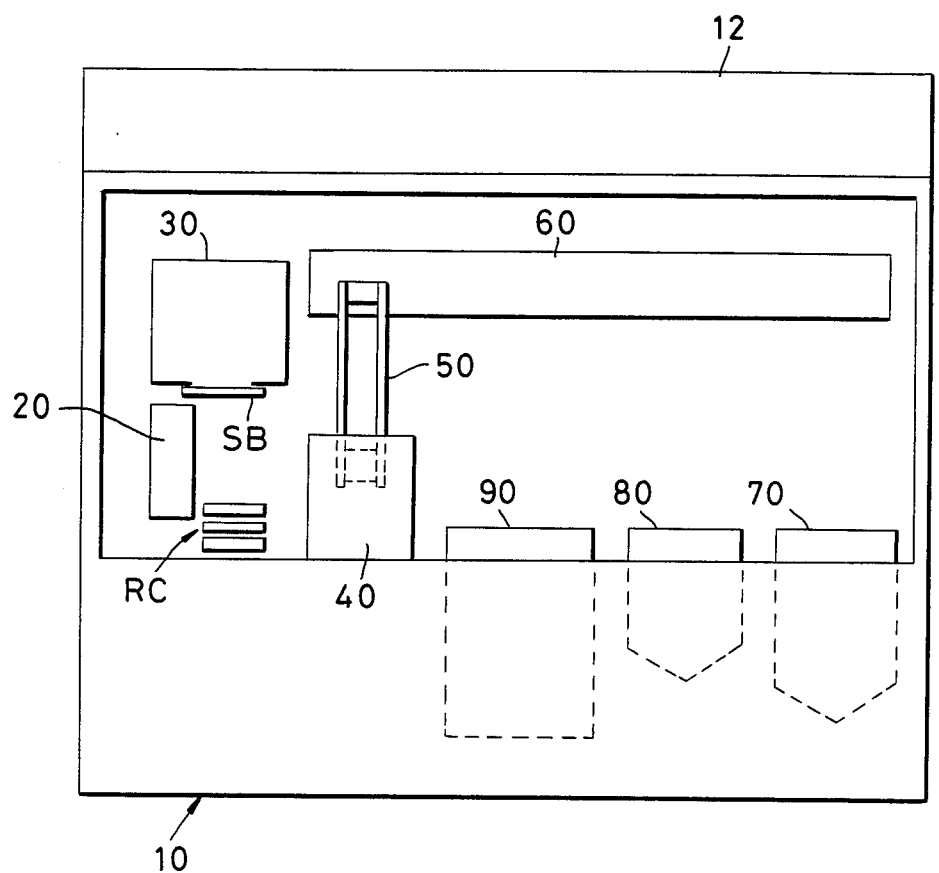
FIG. 1 is a schematic front view of a washing and cleaning system in accordance with the present invention.

FIG. 1 shows a schematic view of a preferred embodiment of an automatic washing (cleaning) system in accordance with the present invention. The whole automatic washing (cleaning) system is disposed within a housing 10 with a cleaning unit 12 for producing clean air free from dust and dirt and is isolated from the surrounding atmosphere. Disposed within the housing 10 are a transfer mechanism 20 for withdrawing a glass substrate to be cleaned such as a photomask with a circuit pattern or reticle out of a reticle case RC and re-inserting it into the same; a foreign particle inspecting unit 30; an attitude change mechanism 40; an arm mechanism 50, a transfer mechanism 60 and a washing unit comprising three tubs 70, 80 and 90. A plurality of reticle cases RC each containing one reticle are disposed within the housing 10. As disclosed in U.S. Pat. No. 4,422,547, issued on Dec. 27, 1983 to Abe et al, the case RC has a door at a position from which a reticle is withdrawn or reinserted in parallel with the wall surfaces of the case RC so that when the reticle is not withdrawn, the case RC is closed by the door. Furthermore, the reticle case RC is so designed and constructed that the periphery of the reticle contained is supported in such a way that the contact of the surfaces of the reticle with the inner wall surfaces of the case RC may be prevented. Moreover, the cases RC can be stacked one over another in a cartridge (not shown) and it is possible to withdraw any desired case from the cartridge.

The case RC containing the reticle is transferred into the foreign particle inspecting unit 30 for detecting whether or not any foreign particle is attached to the surfaces of the reticle and for detecting the size of an attached foreign particle and the position thereof. A slide shutter SB is opened when the reticle is inserted into or withdrawn from the foreign particle inspecting unit 30.

The attitude change mechanism 40 causes the reticle which is maintained in a horizontal position to rotate through 90° into a vertical position. The reticle which is brought to the vertical position is transferred to the arm mechanism 50 which comprises two arms so as to clamp the parallel side edges of the reticle. The transfer mechanism 60 moves the clamped reticle in the horizontal direction along the three tubs 70, 80 and 90 which are disposed in the order of washing steps of the reticle and moves the clamped reticle in the vertical direction so that the clamped reticle is immersed in respective tubs 70, 80 and 90. The tub 70 is disposed at a position most remote from the position where the cases RC are stacked and is adapted to inject a cleaning liquid or agent against the reticle and to rub the reticle with brushes. In the tub 80, alcohol is injected against the reticle so as to remove water from the surfaces of the reticle. Therefore, the tub 80 is called a rinse tub. The tub 90 is a vacuum drying tub in which the reticle is dried with vaporized freon gas.

Figure 2:
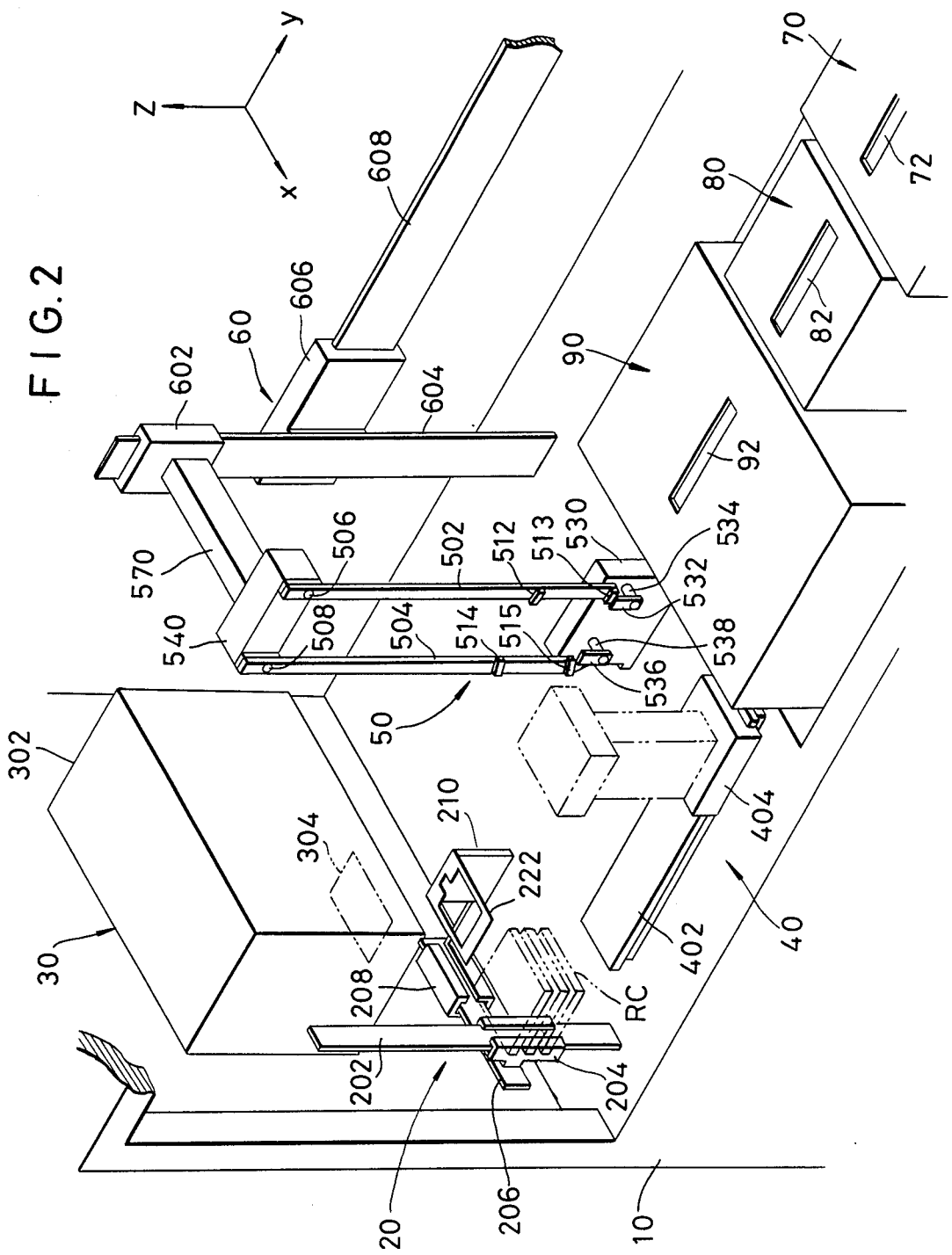
FIG. 2 is a perspective view thereof.

FIG. 2 is a perspective view of the automatic washing (cleaning) system as shown in FIG. 1.

Figure 3:
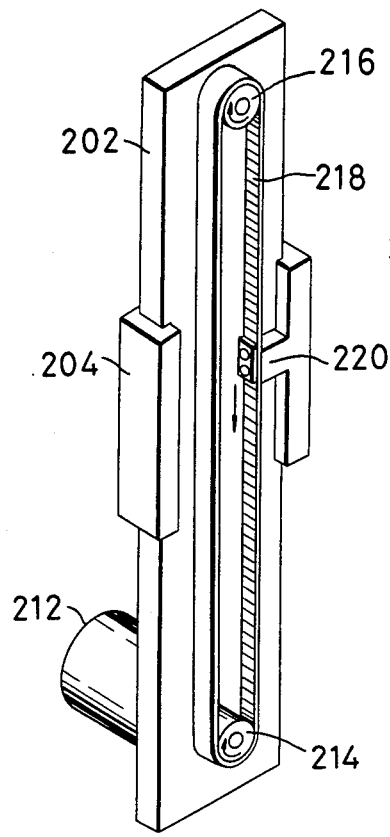
FIG. 3 is a perspective view of a belt drive.
Figure 4:
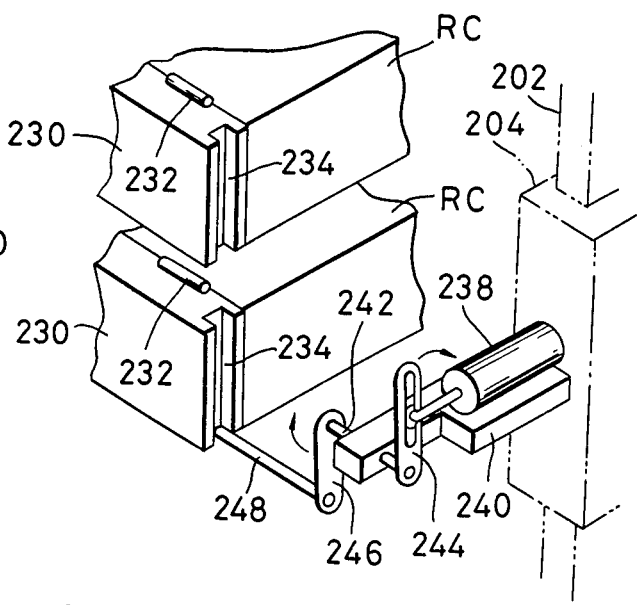
FIG. 4 is a perspective view illustrating a mechanism for opening and closing the door of a reticle case.

The transfer mechanism 20 comprises a vertically (Z direction) extended straight guide member 202, a slider 204 slidable vertically along the guide member 202, a horizontally (X direction) extended straight guide member 206 securely attached to the slider 204 at right angles, a slider 208 slidable along the horizontal guide 206 and an L-shaped arm 210 securely attached to the slider 208. In order to move the vertical slider 204, a belt drive as shown in FIG. 3 is used. More particularly, the horizontal slider 204 is supported through roller bearings or the like by the guide member 202. A pulley 214 which is driven by a motor 212 is disposed at the lower end portion of the guide member 202 and another pulley 216 is rotatably mounted on the vertical guide member 202 adjacent to the upper end thereof. An arm 220 of the slider 204 is securely attached to an endless flat belt 218 wrapped around these pulleys 214 and 216. The horizontal guide member 206 and the slider 208 are substantially similar in construction to that of the vertical guide member 202 and the vertical slider 204. A horizontal holder 222 for supporting the periphery of the reticle is extended from the arm 210. When the horizontal slider 208 is displaced, the holder 222 is inserted into the case RC; that is, into a space defined between the pattern (lower) surface of the reticle in the case RC and the bottom of the case RC. The case RC is provided with the door, as described above, which is in opposed relationship with the holder 222. Therefore, the slider 204 is provided with a mechanism for opening or closing the door when the reticle is withdrawn from or inserted into the case RC as shown in FIG. 4. The door 230 is attached with hinges 232 to the case RC and is swung upwardly when the door 230 is opened. One vertical side edge of the door 230 is formed with a straight groove 234 which is in parallel with the guide member 202. It follows therefore that when a plurality of cases are stacked, the straight grooves 234 are aligned with each other.

An air cylinder 238 with a plunger is mounted on a base 240 which in turn is securely attached to the slider 204 and a shaft 242 with levers 244 and 246 securely fixed thereto is pivotably supported by the base 240. The lever 244 is formed with an elongated slit engageable with the plunger of the cylinder 238 and a pin 248 is extended from the lever 246 for engagement with the groove 234 of the door 230 of the case RC. When the slider 204 is brought to a suitable position, the air cylinder 238 is energized so that the levers 244 and 246 are caused to rotate in unison in the direction indicated by the arrow (in the clockwise direction in FIG. 4) so that the pin 248 revolves about the shaft 242. As a result, the pin 248 causes the door 230 of the case RC, which is located in opposed relationship with the door control mechanism, to move upwardly. That is, the opening of the case RC is opened. On the other hand, when the air cylinder 238 is de-energized, the plunger is returned to its initial position under the force of a coiled spring so that the door 230 is closed.

Figure 5:
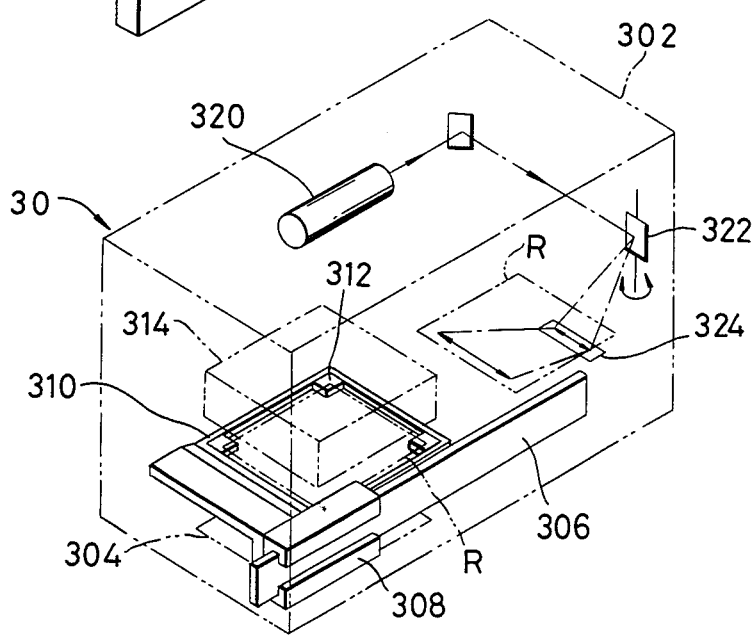
FIG. 5 is a perspective view of a foreign particle inspecting unit.

FIG. 5 shows a perspective view of the foreign particle inspecting unit 30. The whole unit 30 is encased in a light-tight box 302. The bottom of the box 302 is formed with an opening 304 which is opened and closed when the reticle R is inserted into or withdrawn from the unit 30. A slider 308 slides along a guide member 306 disposed within the box 302. The guide member 306 and the slider 308 are substantially similar in construction and mode of operation to the vertical guide member and slider described above with reference to FIG. 3.

The slider 308 has a rectangular supporting frame 310 for holding a reticle in a horizontal position. Vaccum suction holders 312 are provided at four corners over the upper surface of the supporting frame 310. As shown in FIG. 5, the supporting frame 310 is in opposed relationship with the opening 304 when the slider 308 is brought to the leftmost end of the guide member 306. A carrier 314, which is adapted to hold the reticle in a horizontal position, is disposed immediately above the opening 304. The carrier 314 temporarily holds the reticle when the latter is inserted into the box 302 when the holder 222 (See FIG. 2) is lifted and is provided with four holding members for clamping the four sides of the reticle.

When the reticle is to be inserted into the box 302, the slider 308 and the supporting frame 310 are retracted to the rightmost end of the guide member 306; that is, a position remote from the opening 304. The slider 308 is returned to the position as shown in FIG. 5 after the carrier 314 holds the reticle and the holder 222 is lowered and receives the reticle from the carrier 314. Thereafter the slider 308 is again returned to the rightmost position for the inspection of the reticle.

Disposed within the light-tight box 302 is a foreign particle inspecting unit comprising a laser source 320, an oscillating mirror 322 which reflects the laser beam from the laser light source 320 and oscillates through a predetermined angle and a mirror 324 which directs the laser light deflected by a predetermined angle by the oscillating mirror 322 to the surface of the reticle R. Such foreign particle inspecting unit as described above is disclosed in detail in U.S. Pat. No. 4,468,120 issued on Aug. 28, 1984 to Tanimoto et al. The laser beam from the mirror 324 scans the pattern-formed surface of the reticle R. Scattered light rays from the pattern-formed surface and the rear surface of the reticle are detected and compared with each other so that the detailed information of foreign particles; that is, the positions and sizes of foreign particles attached to the both surfaces of the reticle is provided.

Figure 6:
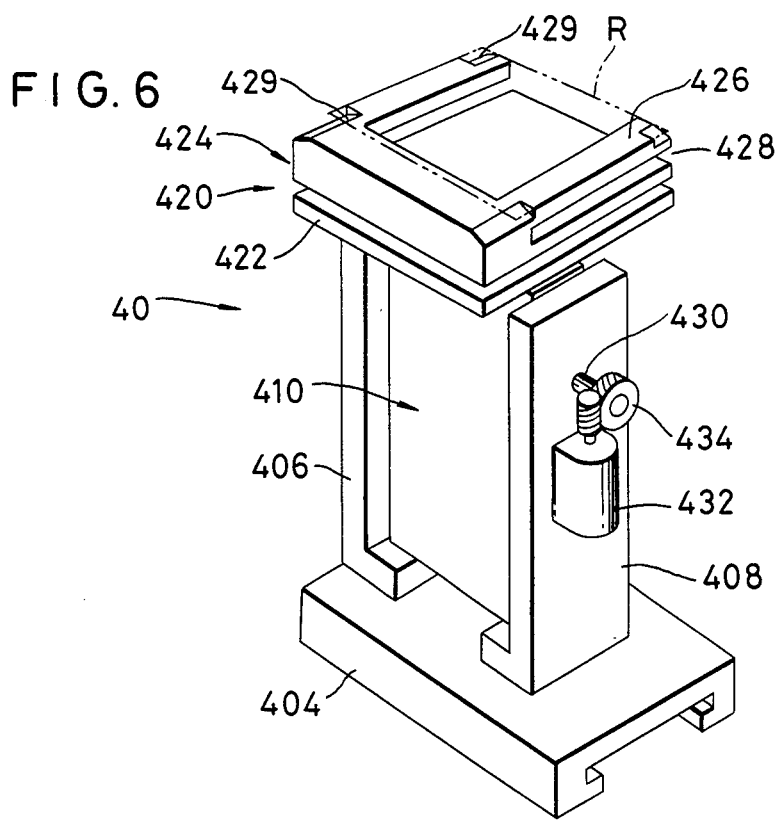
FIG. 6 is a perspective view of an attitude change mechanism.

The attitude change mechanism 40 receives the reticle which has been withdrawn from the case RC and held on the holder 222. A guide member 402 is straightly extended in the y direction so as to guide a slider 404. The slider 404 is also driven by a belt drive described above with reference to FIG. 3. As shown in FIG. 6, two columns 406 and 408 are extended upright from the slider 404 and a swinging unit 410 with a holder 420 for holding the reticle is pivotably supported with pivot pins 430 by the columns 406 and 408. One pivot pin 430 is rotated through 90° through a worm wheel 434 by a motor 432 mounted on the column 408. Therefore the swinging unit 410 with the reticle holder 420 is swung through 90° between the position at which the reticle R is held horizontally as shown in FIG. 6 and the position at which the reticle R is held vertically as shown in FIG. 7.

The reticle holder 420 comprises a base plate 422 securely fixed to the swinging unit 410 and a holder 424 supported through springs by the base plate 422. The holder 424 has a U-shaped holding surface 426 so as to vacuum suck the periphery of a reticle. The U-shaped holding surface 426 has a rectangular opening through which the holder 222 passes. Furthermore, in order to pass the holder 222 in the horizontal direction after the holder 222 has passed the U-shaped aperture downwardly, a slit 428 is formed at the lower portion of the holding surface 426. The holding surface 426 is substantially the same in external size as the reticle R. Notches 429 are formed at respective corners of the holding surface 426.

Figure 7:
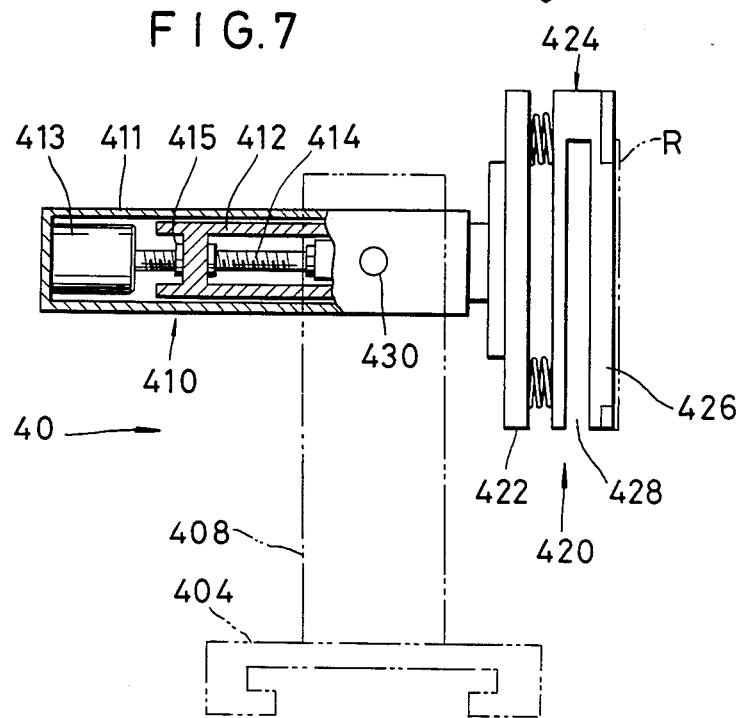
FIG. 7 is a side view, partly in section, thereof.

As best shown in FIG. 7, the swinging unit 410 has an outer casing 411 pivoted with the pivot pins 430 to the columns 406 and 408, an inner casing 412 which is securely fixed to the base plate 422 and is adapted to be slidably inserted into the outer casing 411, a motor 413 mounted at the bottom of the outer casing 411 and a feed screw 414 which is directly connected to the drive shaft of the motor 413 and engages with a nut 415 securely fixed to the inner casing 412. Therefore, when the motor 413 is energized so that the feed screw 414 is rotated, the inner casing 412 is displaced relative to the outer casing 411 in the direction perpendicular to the holding surface 426 of the reticle holder 420.

The reticle R which is maintained in a vertical position as shown in FIG. 7 is transferred to arms 502 and 504 of the arm mechanism 50. The arms 502 and 504 are elongated in the Z direction and have a length sufficient to lower the reticle to a predetermined position in each of the tubs 70, 80 and 90. The upper ends of the arms 502 and 504 are pivotably fixed with pivot pins 506 and 508, respectively, to a supporting member 540.

Figure 8:
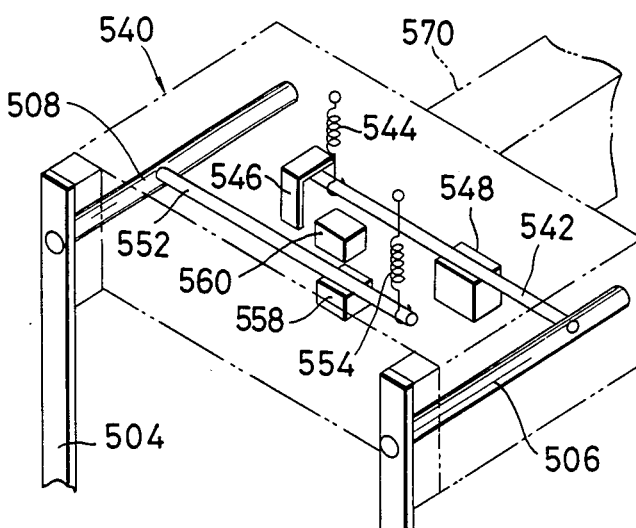
FIG. 8 is a perspective view illustrating the construction of an arm supporting member.

Referring next to FIG. 8, one end of a lever 542 is securely fixed at right angles to the pivot pin 506 of the arm 502 and the other end of the lever 542 is normally biased upwardly by means of a spring 544. A stop 546 limits the upward movement of the other end of the lever 542. As a result, the other end of the lever 542 is normally contacts the stop 546 under the force of the bias spring 544 so that the lever 542 is substantially maintained in a horizontal position and the arm 502 is maintained vertically. A sensor 548 which is disposed adjacent to the lever 542 is used to detect whether or not the lever 542 is maintained horizontally. More particularly, when the arm 502 is maintained vertically, the sensor 548 delivers no output signal, but when the arm 502 is swung from the vertical, the sensor 548 delivers an output signal. Alternatively, such detection as described above can be accomplished by detecting whether or not an electrical contact is established between the lever 542 and the stop 546. One end of a lever 552 is securely fixed at right angles to the pivot pin 508 and the other end of the lever 552 is connected to a spring 554 whose force is weaker than that of the spring 544. Therefore the arm 504 can rotate in the counterclockwise direction about the pivot shaft 508 under the force of the spring 554. It also can rotate in the clockwise direction against the force of the spring 554. Sensors 558 and 560 are disposed adjacent to the lever 552 so as to detect the position of the lever 552. More particularly, when the arm 504 is maintained vertically so that the lever 552 is maintained horizontally, the sensors 558 and 560 deliver no output signal. However, when the arm 504 is caused to rotate in the clockwise direction from the vertical, only the sensor 560 delivers an output signal. On the other hand when the arm 504 is caused to rotate in the counterclockwise direction from the vertical, only the sensor 558 delivers an output signal. The supporting member 540 is connected through a bar 570 to the arm transfer mechanism 60.

Figure 9:
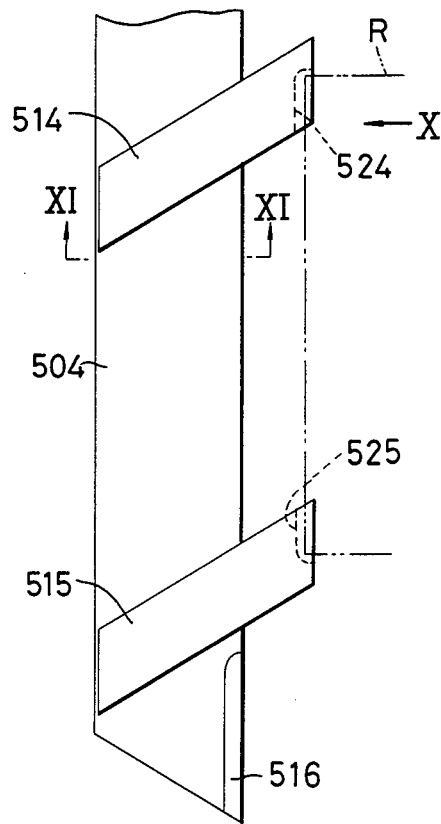
FIG. 9 is a front view of an arm.
Figure 10:
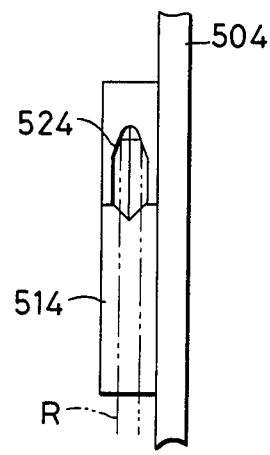
FIG. 10 is a view taken in the direction X in FIG. 9.
Figure 11:
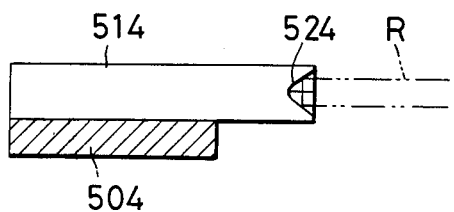
FIG. 11 is a sectional view taken along the line XI—XI of FIG. 9.

Four pawls 512, 513, 514 and 515 which are made of a synthetic resin and are adapted to hold the four corners of the reticle are securely attached to the lower portions of the arms 502 and 504. When the both arms 502 and 504 are maintained vertically, these pawls 512, 513, 514 and 515 clamp the four corners of the reticle R. The construction of these pawls 512, 513, 514 and 515 are shown in detail in FIGS. 9–11. The pawls 514 and 515 are in the form of a parallelogram and attached to the arm 504 at about 30° from the horizontal. The upper and lower pawls 514 and 515 are vertically spaced apart from each other by a distance equal to the side length of the reticle R. V-shaped notches 524 and 525 are formed at the leading ends, respectively, of the pawls 514 and 515 so as to engage with the corners of the reticle. As shown in FIGS. 10 and 11, the corner of the reticle R engages with the V-shaped notch 524. In general, the side edges of a glass substrate such as the reticle or the photomask are beveled so that if the angle of the V-shaped notch is determined depending upon the beveled edge of the reticle, the reticle may be positively held in position. The V-shaped notch 525 is formed in a manner substantially similar to that described above. The oblique sides of the pawls 514 and 515 are inclined downwardly away from the reticle. The reason is that when a reticle is washed, drops of cleaning liquid or pure water flow away from the reticle so that the cleaning liquid or pure water drains fast. A knife-shaped edge 516 is formed at the lower end of the arm 504. The arm 502 and the pawls 512 and 513 are formed in symmetry with the arm 504 and the pawls 514 and 515 with respect to the reticle.

Figure 12:
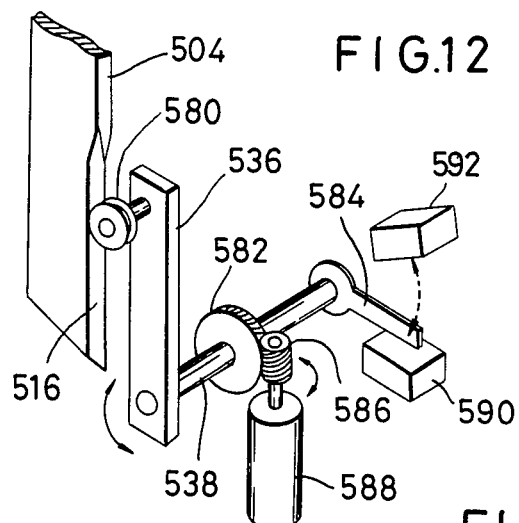
FIG. 12 is a perspective view of an arm opening and closing mechanism.

As shown in FIG. 2, the arms 502 and 504 are opened or closed by an actuator 530 mounted in the housing. The actuator 530 is provided with a rotating member 532 which is adapted to engage with the lower end of the arm 502 upon rotation of a shaft 534 and another rotating member 536 which is adapted to engage with the lower end of the arm 504 upon rotation of a shaft 538. When the rotating members 532 and 536 are maintained substantially vertical as shown in FIG. 2, the two arms 502 and 504 can be also maintained vertical. However, when the rotating member 532 rotates in the counterclockwise direction while the rotating member 536 rotates in the clockwise direction, the two arms 502 and 504 are opened or spaced apart from each other against the forces of the springs 544 and 554 in the supporting member 540. However, when rotating member 532 rotates in the clockwise direction while the rotating member 536 rotates in the counterclockwise direction, the arms 502 and 504 are closed or moved toward each other under the forces of the springs 544 and 554. In practice, the rotating member 536 is provided with a synthetic resin roller 580 as shown in FIG. 12. The roller 580 is formed with a V-shaped peripheral groove which is adapted to engage with the edge 516 of the arm 504. The shaft 538 whose one end is securely fixed to the lower end of the lever 536 carries a worm wheel 582 and a lever 584 for detecting an angle of rotation of the shaft 538. The worm wheel 582 is in mesh with a worm gear 586 joined to the drive shaft of a motor 588. Sensors 590 and 592 detect the angle of rotation of the lever 584 so that the position of the rotating member 536, that is, whether the arm 504 is moved toward or away from the arm 502 can be detected. The rotating member 532 and the shaft 534 are substantially similar in construction and mode of operation to the rotating member 536 and the shaft 538 described above.

When the actuator 530 opens the arms 502 and 504 through a predetermined angle, the distance between the pawls 512 and 514 and the distance between the pawls 513 and 515 become greater than the width of the reticle. Thereafter, the reticle holder 420 of the attitude change mechanism 40 is rotated through 90° and then the motor 413 is energized so that the four corners of the reticle which is vacuum sucked on the holding surface 426 are brought to the positions, respectively, in opposed relationship with the V-shaped notches at the leading ends of the pawls 512-515. Thereafter, the arms 502 and 504 are closed or moved toward each other so that the V-shaped notches of the pawls 512-515 firmly engage with the four corners, respectively, of the reticle.

The reticle R which is held by the arms 502 and 504 is moved toward the tubs 70, 80 and 90 by the arm transfer mechanism 60 which moves in both the y and z directions. As shown in FIG. 2, the mechanism 60 moves a slider 602, which is connected to the bar 570 along a vertical guide 604 upwardly or downwardly in the direction z. The guide 604 is securely fixed to a slider 606 which slides along a guide 608 in the y direction. As described with reference to FIG. 3, motors (not shown) are disposed for driving the sliders 602 and 606, respectively, through belts (not shown).

The tops of the tubs 70, 80 and 90 are formed with slit-like openings 72, 82, and 92, respectively. Each opening is elongated and extended in the y direction. The reticle R which is held by the arms 502 and 504 is transferred by the mechanism 60 in the y direction; that is, in the direction in parallel with the surfaces of the reticle R and then is inserted or withdrawn through the slit-like opening into the tub together with the arms 502 and 504. The reticle is first inserted into the tub 70 in which are disposed a pure water issuing unit, a cleaning liquid issuing unit and rotary brushes.

After the reticle is withdrawn out of the tub 70, it is inserted into the rinse tub 80 in which is disposed a liquid issuing unit which issues a liquid for replacing pure water with isopropyl alcohol. Finally, the reticle is inserted into the vapor drying tub 90 which is filled with freon vapor so as to dry the reticle.

Figure 14A:
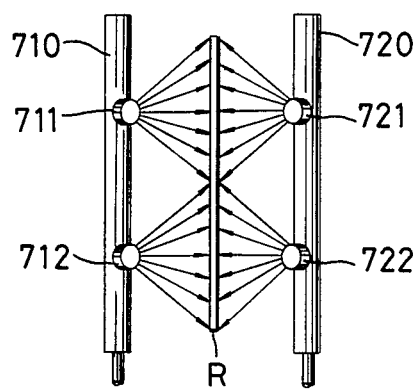
FIG. 14A is a top view illustrating pure water jet nozzles and showing how pure water is jetted.
Figure 14B:
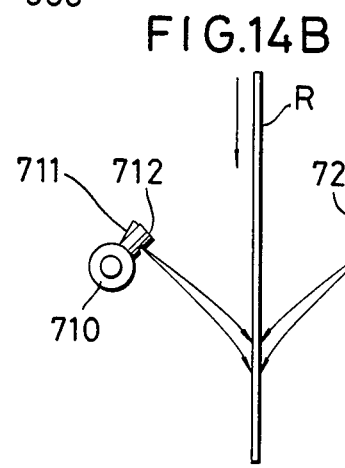
FIG. 14B is a front view thereof.
Figure 13:
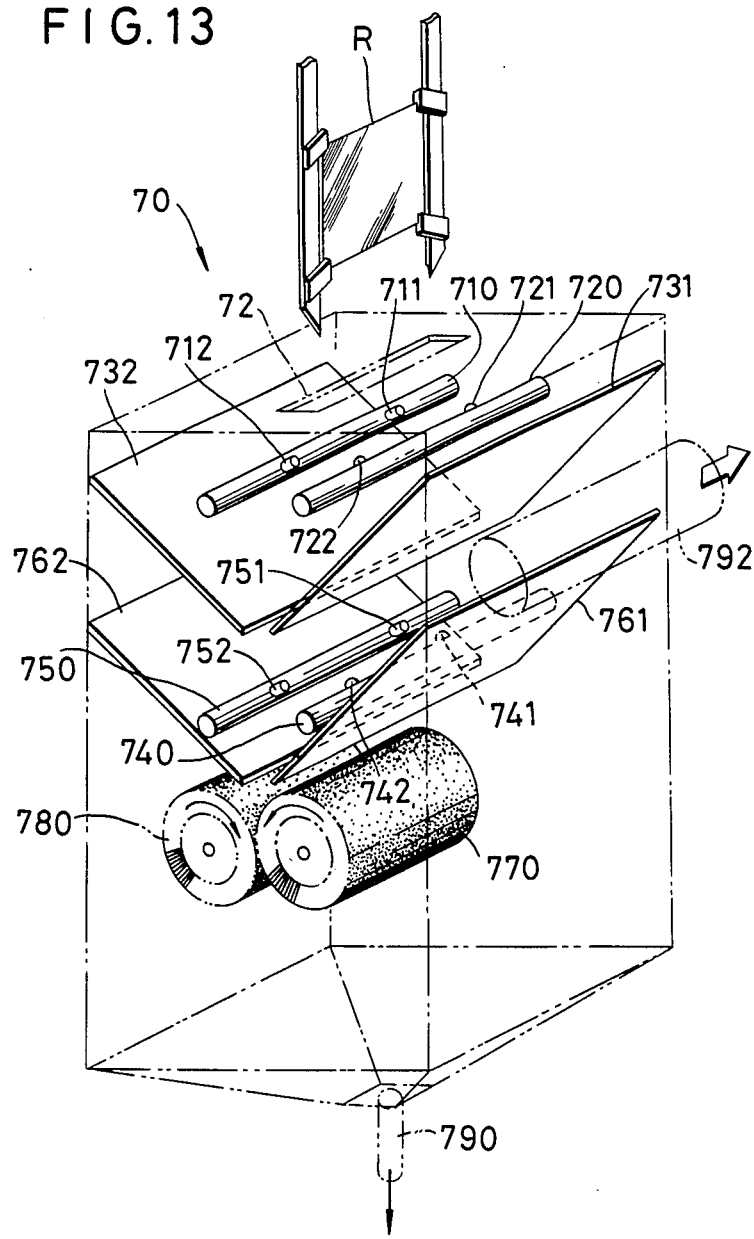
FIG. 13 is a perspective view illustrating the construction of a wash tub.

FIG. 13 shows the interior of the washing tub 70. The pure water jetting unit comprises two parallel pipes 710 and 720 disposed in opposed relationship with the surfaces of the inserted reticle and nozzles 711, 712, 721 and 722, each pipe being provided with two nozzles. Pure water under a predetermined pressure is supplied to the pipes 710 and 720 so that the nozzles 711, 712, 721 and 722 jet fan-like pure water films. More particularly, pure water which is jetted through each nozzle will not spread in the direction of movement of the reticle R, but spreads like a fan along the pipe as shown in FIGS. 14A and 14B. The distance between the nozzles 711 and 712 and the included angle of the fan-shaped fluid sheet are so determined that the fan-shaped pure water sheets can cover the whole one surface of the reticle which moves in the direction perpendicular of FIG. 14A. The same is true for the nozzles 721 and 722 of the pipe 720 so that the fan-shaped pure water sheets can cover the whole other surface of the reticle R. As described above, since the pure water jetted from the fan nozzles will not spread in the direction of movement of the reticle, the jetted pure water becomes in the form of a fan. In order to prevent the overlapping of fan-shaped pure water sheets over the surfaces of the reticle, the axes of the fan nozzles 711 and 712 are not in parallel with each other and the axes of the fan nozzles 721 and 722 are not in parallel with each other as best shown in FIG. 14B. Therefore, the production of a large quantity of splash due to the overlapping of the fan-shaped pure water sheets can be prevented. The axis of each fan nozzle is inclined downwardly so that the fan-shaped pure water sheet may be prevented from impinging against the surface of the reticle at right angles. That is, as shown in FIG. 14B, the fan-shaped pure water sheets impinge against the surfaces of the reticle at angles. Therefore, the foreign particle washing force can be increased and the formation of a large quantity of pure water splash due to the collision between the fan-shaped pure water sheets can be prevented. Because of the reasons described above, it is preferable that the angle between the direction of movement of the reticle and the axis of each fan nozzle is acute and, for instance, is between 5 and 85 degrees. Baffle plates 731 and 732 are disposed in the form of V immediately below the pipes 710 and 720 and the lower edges of the baffle plates 731 and 732 are spaced apart from each other by a predetermined distance so that the arms 502 and 504 holding the reticle may pass between the lower edges of the baffle plates 731 and 732. These baffle plates 731 and 732 are provided in order to prevent pure water jetted from the fan nozzles and/or reflected from the surfaces of the reticle from rushing upwardly in the form of a splash. Depending upon the jetting angles of fan-shaped pure water sheets and the jetting pressure, the included angle between the baffle plates 731 and 732 is preferably between 20 and 160 degrees so as to attain the above-described effect.

As the reticle R is further lowered past the baffle plates 731 and 732, it is jetted with a special cleaning liquid or agent by means of the cleaning liquid jet unit comprising pipes 740 and 750 and nozzles 741, 742, 751 and 752, each pipe being provided with two nozzles. The arrangement of these pipes and nozzles is substantially similar to that of the pure water jet unit described above with particular reference to FIGS. 14A and 14B. A cleaning liquid such as ammonia water under pressure is supplied to the pipes 740 and 750 and fan-shaped cleaning liquid sheets are jetted over the surfaces of the reticle R. In the case of jetting the special cleaning liquid or agent, it is not needed to jet it in the form of a fan. Baffle plates 761 and 762 are disposed below the pipes 740 and 750 in the form of V and prevent ammonia water from rushing or scattering upwardly in the form of a splash. In addition, these baffle plates 761 and 762 serves to prevent a splash from brushes 770 and 780 from rushing or scattering upwardly.

The brush unit comprises two parallel cylindrical rotary brushes 770 and 780. Elastic fibers such as nylon fibers are extended radially outwardly from the cylindrical surface of each rotary brush and the leading ends of these fibers of the brushes 770 and 780 contact with each other or are spaced apart from each other by a small distance. The brush 770 rotates in the counterclockwise direction as indicated by the arrow while the brush 780 rotates in the clockwise direction as indicated by the arrow. Therefore the reticle sandwiched between the brushes 770 and 780 is caused to move downwardly toward the bottom of the tub 70. As a result, foreign particle attached to the surfaces of the reticle are removed downwardly. The axial length of each rotary brush is so determined that the brushes can contact the surfaces of the reticle as much as possible in the widthwise direction, but they are prevented from making contact with the arms holding the reticle.

The bottom of the washing tub 70 is in the form of an inverted pyramid so that used pure water and cleaning liquid can be efficiently collected and discharged through a pipe 790. It is preferable that the vertical angle of the inverted-pyramid-shaped bottom of the washing tub 70 be between 90 and 175 degrees. An exhaust pipe 792 is extended through the side wall of the washing tub 70 adjacent to the cleaning liquid jet unit so that ammonia gas in the tub 70 is discharged into a purifying device (not shown).

Figure 15:
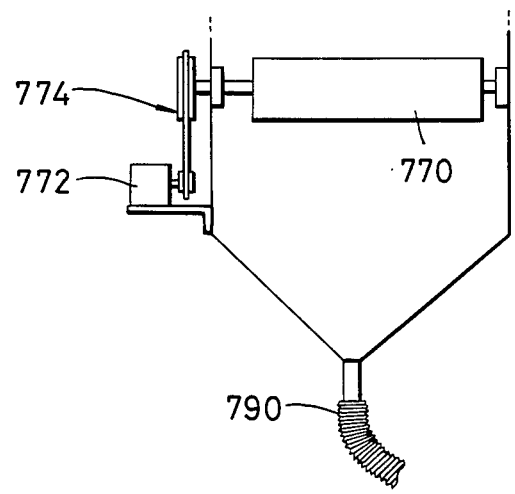
FIG. 15 is a front view illustrating schematically the construction of the wash tub.

Referring next to FIG. 15, a motor 722 for driving the rotary brush 770 is mounted on the washing tub 70 on the rotation of the motor 772 is transmitted to the shaft of the brush 770 through a belt drive 774. The same is true for the other rotary brush 780. That is, a motor (not shown) and a belt drive (not showm) are provided so as to drive the brush 780.

Figure 16:
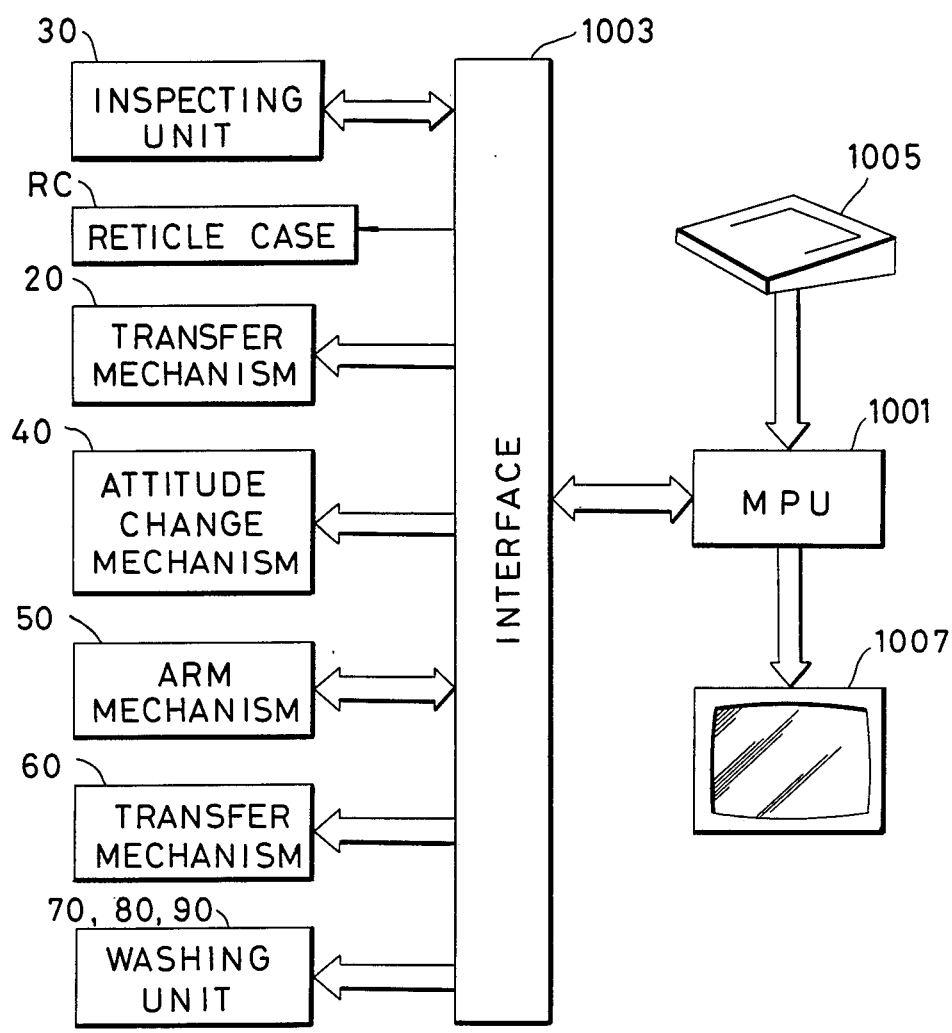
FIG. 16 is a block diagram of a control system for controlling the automatic washing and cleaning system of the present invention.

FIG. 16 shows the control system of the automatic photomask or reticle cleaning system in accordance with the present invention. The sequence of operations of the automatic cleaning system is controlled by a conventional microprocessor 1001 including memories such as RAMs and ROMs. An interface 1003 is used so that instructions are transmitted from the microprocessor 1001 to various units and mechanisms and the output signals are transmitted from various sensors to the microprocessor 1001.

A keyboard 1005 for feeding instructions and a display 1007 for displaying the sequence progress and results of inspection are connected to the microprocessor 1001.

The microprocessor 1001 executes through the interface 1003 the program as shown in FIGS. 17A and FIG. 17B.

At the first step (step 1), an operator enters through the keyboard 1005 an instruction for selecting a case RC containing a reticle to be cleaned. In response to this instruction, the transfer mechanism 20 maintains the holder 222 in opposed relationship with the door 230 of the selected case RC and the air cylinder 238 is energized so as to open the door 230 and then withdraw the reticle.

In the step 2, the microprocessor 1001 controls the automatic cleaning system in such a way that the holder 222 is inserted through the opening 304 into the housing or case 302 by opening the shutter SB.

The microprocessor 1001 then determines whether or not the reticle is to be inspected prior to washing and cleaning. A selection instruction is previously entered by the keyboard. If the foreign particle inspection is selected, the step 4 is executed so that the reticle is held by the holding frame 310 and transferred to the foreign particle inspecting unit 30. The reticle is then set at the inspection position.

The foreign particle inspection is carried out in the manner disclosed in the above-mentioned U.S. Pat. No. 4,468,120 and after the inspection, the reticle is again placed on the holder 222. When the reticle is judged to be washed and cleaned as a result of the inspection, the step 5 is executed so that the reticle is transferred from the holder 222 to the reticle holder 420 of the attitude change mechanism 40.

In response to an instruction from the microprocessor 1001, the slider 404 is moved so that the reticle holder 420 is brought to the position immediately below the holder 222. At this position, the holder 222 moves downwards through the U-shaped opening of the reticle holder 420 so that the reticle is placed on the holding surface 426 of the reticle holder 420. In this case, the vacuum suction of the plate 222 is released while the holding surface 426 vacuum sucks the reticle. Thereafter, the slider 404 is moved along the guide member 402 to the position at which the stand 420 is in opposed relationship with the arm mechanism 50. In this case, the holder 222 passed past the slit 428 of the holding surface 426. Next upon energization of the motor 432, the reticle holder 420 in opposed relationship with the arm mechanism 50 is rotated through 90° as shown in FIG. 7.

In the step 6, the microprocessor 1001 energizes the motor 588 so that the arms are spaced apart from each other or opened. When the arms 502 and 504 are moved away from each other so that the reticle may be clamped between them, the sensors 548 and 558 (See FIG. 8) delivers the output signals. As a result, the rotating member 536 is further rotated until the arms 502 and 504 are spaced apart from each other by a predetermined distance. Then the sensor 590 (See FIG. 12) delivers the output signal.

In the step 6, the reticle is transferred to the arm mechanism. The microprocessor 1001 energizes the motor 413 so that the reticle holder or stand 420 is moved by a predetermined distance. As a result, the four corners of the reticle which is attracted by the holding surface 426 become in opposed relationship with the four pawls 512-515, respectively. Next the arms 502 and 504 are closed or moved toward each other so that the notches 524 and 525 of the pawls hold the four corners of the reticle. Then the vacuum suction of the holding surface 426 is released and the reticle holder or stand is returned so that the reticle is now suspended from the arm mechanism.

Figure 18:
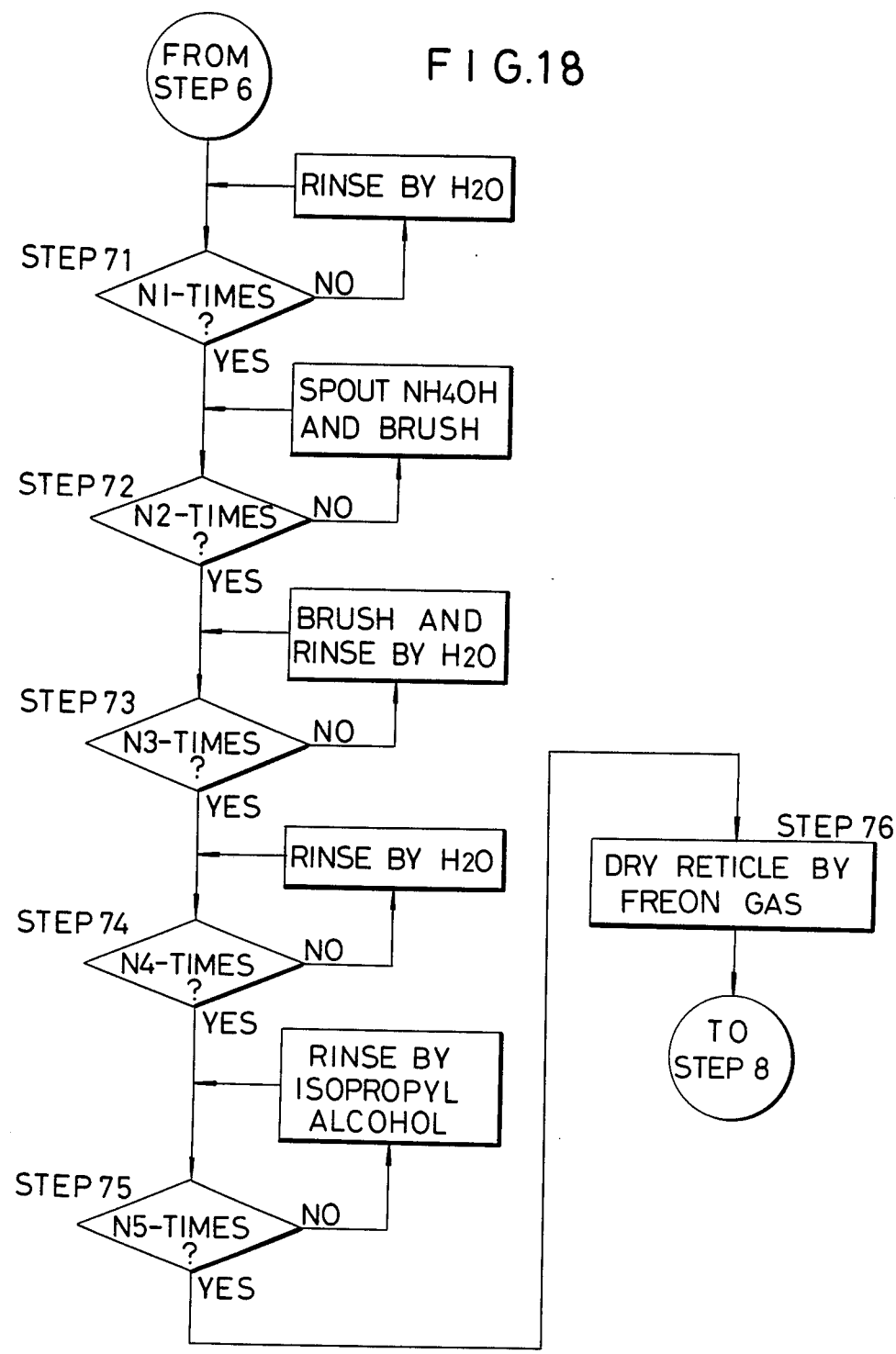
FIG. 18 shows a flow chart used to explain a washing and cleaning process.

In the step 7, the microprocessor 1001 controls the automatic cleaning system according to the sub-routine shown in FIG. 18. That is, the microprocessor 1001 brings the reticle at the position immediately above the washing tub 70 and gives an instruction to the arm mechanism so that the reticle is lowered to the position at which the reticle is in opposed relationship with the pure water jet unit in the washing tub 70. Next it is determined whether or not the pure water jet unit washes the reticle $N_1$ times. $N_1$ times represent the times of reciprocation of the reticle through the pure water jet unit and include zero. Since the reticle has not been rinsed with pure water yet, pure water is jetted through the fan nozzles 711, 712, 721 and 722. In this case, the reticle is lifted at a predetermined velocity so that pure water can be jetted against the reticle from its upper side edge to its lower side edge. When pure water is jetted against the lower side edge of the reticle, the reticle is lowered again. Thus, one reciprocation is accomplished and the step 71 is repeated.

During the time when the reticle is vertically reciprocated in the manner described above, pure water is continuously jetted so that the surfaces of the reticle are wetted. In some cases, foreign particles which weakly attach to the surfaces of the reticle are washed away by the pure water jetting pressure.

Upon completion of rinsing the reticle with pure water, the microprocessor 1001 causes the nozzles 741, 742, 751 and 752 to jet ammonia water. In the step 72, it is determined whether or not brushing is carried out $N_2$ times (except zero) by the cleaning liquid jet unit and the rotary brushes 770 and 780. Since brushing has not been carried out yet, the reticle is lowered until its upper side edge is clamped by the brushes 770 and 780 and then lifted until ammonia water is jetted against the lower side edge of the reticle. In this manner, the reticle is vertically reciprocated and the brushing of the surfaces of the reticle with ammonia water is carried out.

Upon completion of the step 72, the next step 72 is carried out. That is, it is determined whether or not the brushing with pure water is repeated $N_3$ times (except zero). The object of this brushing is to wash with pure water the upper portions of the arms holding the reticle. Ammonia splash attached to the arms reacts with freon vapor in the next step; that is, the drying step in the vapor tub so that the drying effect (sic) is degraded. Therefore, when the reticle is lowered to the lowermost position in the preceding step, pure water is jetted through the nozzles 711, 712, 721 and 722. In this case, the rotary brushes 770 and 780 rotate simultaneous with the jetting of pure water. Pure water is generally jetted against the upper portions of the arms so that ammonia water splash attached to the arm is washed away. In this case, the reticle is vertically reciprocated in a manner substantially similar to that described above with reference to the step 72. When the jet of ammonia water is interrupted during the step 73, the arms can be more thoroughly washed and cleaned.

In the next step 74, the rinsing with pure water is carried out as in the case of the step 71 so that ammonia water remained on the surfaces of the reticle and the lower portions of the arms is washed away.

Upon completion of the step 74, the reticle is transferred and inserted into the next rinse tub 80 and is reciprocated vertically $N_5$ times. In the rinse tub 80, isopropyl alcohol is sprayed over the surfaces of the reticle. When the surfaces of the reticle are sufficiently substituted with alcohol, the reticle is transferred and inserted into the next vapor drying tub 90. The reticle is dried by freon vapor in the tub 90.

It is preferable that the rotary brushes 770 and 780 in the washing tub 70 be self-cleaned. This may be accomplished by jetting again pure water after the reticle has been retracted away from the washing tub 70 and rotating the brushes 770 and 780 so that foreign particles removed from the reticle and attached to the brushes 770 and 780 can be washed away.

After the reticle has been thoroughly washed and cleaned in the manner described above, it is transferred to the attitude change mechanism 40. The holder or stand 420 holds the reticle and is rotated through 90° in the opposite direction so that the reticle is maintained horizontally. Thereafter the reticle holder or stand 420 is moved along the guide member 402 to the position at which the holder or stand 420 is in opposed relationship with the holder 222.

Thereafter the reticle is again inserted into the foreign particle inspecting unit 30 to determine whether or not the reticle has been thoroughly washed and cleaned to a satisfactory degree; that is, to determine whether or not foreign particles have been completely removed from the reticle. If the foreign particle removal is satisfactory, the reticle is transferred by the transfer mechanism 20 and re-inserted into the case RC. If foreign particle removal is not satisfactory, the reticle is washed and cleaned again in a manner substantially similar to that described above. However, if foreign particles still remain on the reticle after a predetermined number of washing and cleaning steps, the reticle is considered to have a scratch or the like greater than average foreign particles. In this case, the reticle is re-inserted into the case RC and the display 1007 displays that this reticle has a scratch or the like.

What is claimed is:

1. A system for washing and cleaning the surfaces of a flat substrate horizontally encased in a case comprising:

means for inspecting foreign particles attached to the surface of said flat substrate, said inspecting means including first holder means for holding said flat substrate in a horizontal state;

means for washing the surface of said flat substrate so as to remove foreign particles attached to the surfaces of said flat substrate and including second holder means for holding said flat substrate in a vertical state and a washing unit for washing and cleaning the surface of said flat substrate held by said second holder means;

attitude change means for shifting the attitude of said flat substrate between the horizontal state and the vertical state;

first transfer means for withdrawing said flat substrate from said case and transferring said flat substrate to said second holder means through said attitude change means, the attitude of said flat substrate being changed from the horizontal state to the vertical state by said attitude change means;

second transfer means for transferring said flat substrate from said second holder means to said first holder means through said attitude change means, the attitude of said flat substrate being changed from the vertical state to the horizontal state by said attitude change means; and third transfer means for transferring said flat substrate from said first holder means into said case.

2. A system according to claim 1, further comprising a housing in which said case, said inspecting means, said washing means, said attitude change means and said first, second and third transfer means are disposed and a cleaning unit for producing clean air free from dust and dirt in said housing.

3. A system for washing and cleaning the surfaces of a flat substrate horizontally encased in a case comprising:

means for inspecting foreign particles attached to the surface of said flat substrate and including first holder means for holding said flat substrate in a horizontal state;

means for washing the surface of said flat substrate so as to remove foreign particles attached to the surface of said flat substrate and including second holder means for holding said flat substrate in a vertical state and a washing unit for washing and cleaning the surface of said flat substrate held by said second holder means;

means for transferring said flat substrate between said case, said first holder means and said second holder means and including attitude change means for shifting the attitude of said flat substrate between the horizontal state and the vertical state, said attitude change means being operated when said flat substrate is transferred between said case and said second holder means and transferred between said first holder means and said second holder means, respectively; and means for controlling said transfer means, said inspecting means and said washing means according to a predetermined program.

4. A system according to claim 3, further comprising a housing in which said case, said inspecting means, said washing means and said transfer means are disposed and a cleaning unit for producing clean air free from dust and dirt in said housing.

5. A system according to claim 3, wherein said controlling means controls the sequence of transferring said flat substrate from said case to said first holder means, inspecting said flat substrate, transferring said flat substrate from said first holder means to said second holder means, washing said flat substrate, transferring said flat substrate from said second holder means to said first holder means, inspecting said flat substrate and transferring said flat substrate from said first holder means to said case.

6. A system for washing and cleaning the surfaces of a flat substrate comprising:

case means for containing said flat substrate in a horizontal state;

means for inspecting foreign particles attached to the surface of said flat substrate and including first holder means for holding said flat substrate;

means for washing the surface of said flat substrate so as to remove foreign particles attached to the surface of said flat substrate and including second holder means for holding said flat substrate in a vertical state and a washing unit for washing and cleaning the surface of said flat substrate held by said second holder means;

means for transferring said flat substrate between said case means, said first holder means and said second holder means and including attitude change means for shifting the attitude of said flat substrate between the horizontal state and the vertical state; and means for sequentially controlling said transfer means, said inspecting means and said washing means, wherein said attitude change means is operated by said control means when said flat substrate is transferred between said case means and said second holder means by way of said first holder means and when said flat substrate is transferred between said case means and said second holder means without passing through said first holder means.

7. A system according to claim 6, wherein said first holder means holds said flat substrate in a horizontal state and said attitude change means is operated when said flat substrate is transferred between said first holder means and said second holder means.

8. A system for washing and cleaning the surfaces of a flat substrate comprising:

case means for containing said flat substrate in a horizontal state;

means for inspecting foreign particles attached to the surface of said flat substrate and including first holder means for holding said flat substrate;

means for washing the surface of said flat substrate so as to remove foreign particles attached to the surface of said flat substrate and including second holder means for holding said flat substrate in a vertical state and a washing unit for washing and cleaning the surface of said flat substrate held by said second holder means;

means for transferring said flat substrate between said case means, said first holder means and said second holder means and including attitude change means for shifting the attitude of said flat substrate between the horizontal state and the vertical state; and means for sequentially controlling said transfer means, said inspecting means and said washing means, wherein said attitude change means is operated by said control means when said flat substrate is transferred between said case means and said second holder means by way of said first holder means.

9. A system according to claim 8, wherein said first holder means holds said flat substrate in a horizontal state and said attitude change means is operated when said flat substrate is transferred between said first holder means and said second holder means.

* * * * *